US006880112B2

(12) United States Patent
Lajolo

(10) Patent No.: US 6,880,112 B2
(45) Date of Patent: Apr. 12, 2005

(54) METHOD AND APPARATUS FOR ONLINE DETECTION AND CORRECTION OF FAULTS AFFECTING SYSTEM-ON-CHIP BUSES

(75) Inventor: Marcello Lajolo, Princeton, NJ (US)

(73) Assignee: NEC Corporation, Tokyo (JP)

( * ) Notice: Subject to any disclaimer, the term of this patent is extended or adjusted under 35 U.S.C. 154(b) by 569 days.

(21) Appl. No.: 09/968,778

(22) Filed: Oct. 3, 2001

(65) Prior Publication Data

US 2002/0188892 A1 Dec. 12, 2002

Related U.S. Application Data

(60) Provisional application No. 60/281,001, filed on Apr. 4, 2001.

(51) Int. Cl.[7] .............................................. G06F 11/00
(52) U.S. Cl. ......................................... 714/42; 714/37
(58) Field of Search ............................ 714/42, 37, 39, 714/41, 43, 57, 44, 25, 30, 733, 734; 365/210, 200; 716/5, 1, 7

(56) References Cited

U.S. PATENT DOCUMENTS

| 4,970,454 | A | * | 11/1990 | Stambaugh et al. ....... 324/73.1 |
| 5,898,597 | A | * | 4/1999 | Scepanovic et al. ........... 716/9 |
| 6,026,223 | A | * | 2/2000 | Scepanovic et al. .......... 716/10 |
| 6,550,042 | B1 | * | 4/2003 | Dave ............................. 716/5 |
| 6,678,645 | B1 | * | 1/2004 | Rajsuman et al. ............ 703/20 |
| 6,718,508 | B2 | * | 4/2004 | Lodge et al. ................ 714/780 |

OTHER PUBLICATIONS

Hai Zhou et al.; "Global Routing With Crosstalk Constraints"; Design Automation Conference; 1998; pp. 1–4.
Zhan Chen et al.; "Crosstalk Minimization in Three–Layer HVH Channel Routing"; 1997; pp. 38–42.
Xiaoliang Bai et al.; "Self–Test Methodology for At–Speed Test of Crosstalk in Chip Interconnects"; 2000; pp. 1–6.
Cecilia Metra et al.; "Self–Checking Detection and Diagnosis of Transient, Delay, and Crosstalk Faults Affecting Bus Lines"; 2000; pp. 560–574.
M. Rebaudengo et al., "Evaluating System Dependability in a Co–Design Framwork"; Mar. 2000; pp. 1–5.
Ken Gray; "Adding Error–Correcting Circuitry to ASIC Memory"; The Practical Engineer; Apr. 2000; pp. 55–60.

* cited by examiner

Primary Examiner—Nadeem Iqbal
(74) Attorney, Agent, or Firm—Sughrue Mion, PLLC

(57) ABSTRACT

This paper presents a methodology for designing System-On-Chip interconnection architectures providing a high level of protection from crosstalk effects. An event driven simulator enriched with fault injection capabilities is exploited to evaluate the dependability level of the system being designed. The simulation environment supports several bus coding protocols and thus designers can easily evaluate different design alternatives. To enhance the dependability level of the interconnection architecture, we propose a distributed bus guardian scheme, where dedicated hardware modules monitor the integrity of the information transmitted over the bus and provide error correction mechanisms.

10 Claims, 16 Drawing Sheets d(a,b)=1.45
d(b,c)=1.28
d(a,c)=2.35
cost=(1.45x2)+(1.28x5)+(2.35x1)=11.65 d(a,b)=1.15
d(b,c)=1.92
d(a,c)=1.68
cost=(1.15x2)+(1.92x5)+(1.68x1)=13.58

Single error with the duration of 2ns

Correction Time (0.45ns)

METHOD AND APPARATUS FOR ONLINE DETECTION AND CORRECTION OF FAULTS AFFECTING SYSTEM-ON-CHIP BUSES

This application claims the benefit of U.S. Provisional Application No. 60/281,001, filed Apr. 4, 2001.

BACKGROUND OF THE INVENTION

1. Field of the Invention

The present invention relates to a method and apparatus for detecting and correcting faults on busses, and more particularly relates to a method and apparatus for online detection and correction of faults affecting system-on-chip busses.

2. Description of Related Art

In recent generations of application specific integrated circuit (ASIC) technologies, the width and pitch of interconnect metal have been decreasing while clock frequencies have been increasing. This raises concern about on-chip crosstalk effects due to the ability of signals traveling on one wire to affect the speed of signals traveling on adjacent or victim wires. In extreme cases, crosstalk can cause signals to spike on the victim wires.

Crosstalk is related to the cross-coupling capacitance and inductance between interconnects. It is becoming more and more important due to the sharply increasing number of components and cores in a single chip that create the need for global interconnects. Long interconnects increase tremendously the rate of errors due to crosstalk. This problem with long interconnects will dominate future System-On-Chip (SOCs).

Due to the continuously shrinking geometry of semiconductor chips, the width of the wires is reduced, thereby increasing the wires' resistance; as a consequence, the delay introduced by wires is increasing. One solution to this problem is to increase the thickness of the wires in order to increase their cross-section, thereby reducing the wires' resistance. However, this solution increases crosstalk problems because wires on different layers have less space between them. Another solution is to use copper wires which have a resistivity lower that that of aluminum wires. Although some companies (in particular IBM) have already migrated most of its microprocessors to copper wires, this solution only postpones the cross-talk problem by several years.

Crosstalk has been extensively analyzed in the past and several design techniques have been proposed, especially at the physical design level. See for example: Zhou et al., "Global Routing with Crosstalk Constraints," *Proc. Design Automation Conf.*, pp. 374–77, Jun. 1998; and Z. Chen et al., "Crosstalk Minimization in Three-Layer HVH Channel Routing," *Proc. IEEE Int'l Symp. on Defect and Fault Tolerance in VLSI Systems*, pp. 38–42, 1997. The basic solution is to compensate for crosstalk effects in the wire delay calculation, and integrate the compensation into the layout process.

The integration is generally implemented by factoring in a coupling capacitance extracted from the layout and by using a worst-case signal-switching scenario. Conservative factors are chosen after analyzing crosstalk on a representative cross section of the layout using different routing pitches on signal interconnect metal. The goal is to find the right balance between metal pitch, area used, and chip timing. Hopefully, with a slight increase in chip area, it will be possible to design crosstalk free layouts.

However, the problem is that with the continuously increasing complexity of systems, it is not always possible to adopt very conservative layout rules to eliminate the need for crosstalk and electromigration analysis. Therefore, alternative solutions must be found.

Although some analysis tools have recently appeared (see for example, X. Bay, et al. "Self-Test Methodology for At-Speed Testing of Crosstalk in Chip Interconnects," *Proc. Design Automation Conf.*, pp. 619–24, Jun. 2000), there is still an urgent need for analysis and synthesis tools able to reduce the amount of overhead required to minimize signal integrity problems.

One recently proposed method presented a self-checking detection and diagnosis scheme for several kinds of faults (transient, delay and crosstalk) affecting bus lines of synchronous systems. See C. Metra et al., "Self-Checking Detection and Diagnosis of Transient, Delay, and Crosstalk Faults Affecting Bus Lines, *IEEE Trans. Computers*, vol. 49, pp. 560–74, Jun. 2000. An important difference with respect to the present invention is that, unlike the Metra et al. method, the present invention proposes a system-level approach that is able to leverage CMOS fabrication process parameters and chip characterization parameters in order to extract a list of temporal faults to be applied to the system being designed during a high-level co-simulation session.

BRIEF SUMMARY OF THE INVENTION

It is an object of the invention to provide a method, apparatus and system that reduces crosstalk. Safe layout rules and insertion of buffers and repeaters address crosstalk at the electrical level. However, the present invention addresses crosstalk at the logical level. The invention inserts bus guardians at the gate-level or register transfer level and then applies gate sizing, wire sizing and routing optimizations of long interconnects on the transistor-level net list after bus guardians have been inserted.

Briefly, to achieve the above and other objects and features, the invention includes methods and apparatuses including the following.

One embodiment includes a system comprising a bus; a plurality of SOC components, each connected to the bus; and a bus guardian connected to the bus between at least two of the SOC components. The bus guardian detects and corrects a fault that occurs on the bus between at least two SOC components.

Another embodiment includes a bus guardian for detecting and correcting a fault on a bus between two SOC components that includes: decoding logic connected to the bus; error detection and correction logic connected to the decoding logic and the bit-flip logic; bit-flip logic connected to the decoding logic and the error detection and correction logic; and encoding logic connected to the bit-flip logic, error detection and correction logic and the bus.

Another embodiment includes a method for distributing one or more bus guardians and SOC components on a bus in a system on a chip including determining a CMOS fabrication parameter of the system on a chip; and determining a distance between the bus guardian or guardians and a SOC component based on the fabrication parameter.

Another embodiment includes a method for distributing one or more bus guardians and SOC components on a bus in a system on a chip including estimating a floorplan based on a specification and determining a distance between the bus guardian or guardians and a SOC component based on the floorplan parameter.

The present invention proposes a system-level approach able to leverage on environment and chip characterization parameters in order to extract a list of temporal faults to be applied to the system being designed during a high-level co-simulation session.

Online detection and protection mechanisms can thus be tested in the target environment, prior to the actual implementation of the chip, in order to allow an early evaluation of bus protection efficiency and its impact on the overall system performance. The present invention was developed in the context of two problems: (1) identifying general cases in which crosstalk effects could play a significant role in the overall performance of an electronic chip; and (2) deriving a set of rules to be adopted at the system level in order to avoid crosstalk effects.

For example, consider a small system consisting of two adjacent lines 10, 11 as shown in FIG. 1. To estimate the coupling effect among these two lines, the following procedure is used. A square pulse of a given frequency and with a 1 Volt swing (0V, 1V) is applied on one line 10 (active line), while keeping the other line 11 (victim line) quiet. Both lines are terminated with a capacitor 12, 13, which has a capacitance of 0.1 pF, connected to ground. The waveform observed in the time domain on victim line 11 is a glitch of a given amplitude. A problem arises if this glitch is higher than a given threshold, because it could be detected as a logical level 1 instead of 0.

For this invention, a widely used SPICE-like software simulator called HPMDS (Hewlett-Packard Microwave Design System) was used. This software includes some models for coupled microstrip lines that could be used quite easily by simply specifying the width and the length of the wires on a predefined substrate. However, this is not the most accurate model than can be used because the range of the line sizes for which the model is accurate is far beyond the size of the lines used in current digital silicon technologies. For this reason, the HPMDS model was used as a first reference. Then the model was verified with a more accurate, but also more complicated, tool. To do this, a full wave analysis of several structures through the use of an electromagnetic simulator called Ensemble (from Ansoft) was used. This software is a moment method based electromagnetic simulator that can analyze any defined shapes and coupling or radiating effects over any substrate. One of the key issues when using an electromagnetic simulator is the gridding process or, in other terms, how the structure under analysis is discretized and decomposed in spatial basis functions. The goal was to have a convergence of the simulation process on a 1 $\mu$m width, therefore, the structure was meshed using a set of 0.17 $\mu$m square cells. A finer decomposition would produce more accurate results, but would also require more computational power.

After having experimented with several different cases, the values obtained in a simulation carried out with HPMDS tended to overestimate the coupling effect with respect to the moment method simulation. Therefore, it was reasonable to use the HPMDS results as a safe boundary for the probability of errors due to coupling effects.

FIG. 2 shows the results obtained by varying the frequency of the signal on active line 10 from 50 to 2000 MHz and the length L of both lines from 20 $\mu$m to 1000 $\mu$m. The width W was fixed at 3 $\mu$m and the spacing S at 0.7 $\mu$m. It is important to note that these values have been selected based on data available from the Semiconductor Industry Association Roadmap. See, "Semiconductor Industry Association Roadmap 1997," http://notes.sematech.org/ntrs/PubINTRS.nsf.

The amplitude of the signal injected on the victim line 11 was observed and represented with different shading in the regions corresponding to different ranges in the amplitude. See FIG. 2.

For each frequency, a correction was made to the thickness of the metallization based on the roadmap given in the semiconductor Industry Association Roadmap.

For example, with L=200 $\mu$m and F=1600 MHz, the injected signal has an amplitude between 0.6 and 0.8 V. This is definitely a situation to avoid. On the other hand, if L=200 $\mu$m and F=150 MHz, the injected signal has an amplitude between 0 and 0.2 V, which is quite safe.

FIG. 3 shows the same information shown in FIG. 2 in a three-dimensional chart. This representation is useful in order to extract the probability of error due to crosstalk given the length of the wires and the frequency of the signal injected on active line 10. For example, with a frequency of 500 MHz and assuming a perfect trigger at 0.5 V, the length of the wires cannot be increased over 130 $\mu$m.

Based on these results, it is clear that depending on the frequency of the signals and the physical dimensions of the wires on the chip, there are different crosstalk effect figures that are generally not readily predictable. In particular, in deep sub-micron technologies, it is not always be possible to adopt safe layout rules that can ensure that a chip is 100% free of crosstalk.

These problems constitute the basic motivation that led to this invention which is to develop a methodology for designing System-On-Chip interconnection architectures that are robust enough to tolerate a significant amount of crosstalk during normal chip operation.

BRIEF DESCRIPTION OF THE DRAWINGS

The above and further objects, features and advantages of the invention will become clear from the following more detailed description when read with reference to the accompanying drawings in which.

DETAILED DESCRIPTION OF THE INVENTION

The purpose of this invention is to provide a system-level framework for evaluating and enhancing the dependability level of a SOC interconnection architecture. An event driven simulator enriched with fault injection capabilities is used to evaluate the dependability level of a system when bus errors modify the information sent over the system interconnection architecture. Information on the simulator is contained in M. Lajolo, L. Lavagno, M. Redaudengo, M.S. Recorda, and M. Violante, "Evaluating System Dependability in a Co-Designed Framework," Proc. Design Automation and Test in Europe, pp. 586–590, March 2000.

The simulator supports several bus coding techniques and thus designers can easily evaluate alternative design solutions without incurring the high overhead required to implement a bus coding scheme. Moreover, to guarantee a high dependability level, a distributed bus guardian architecture is proposed in which dedicated hardware modules constantly monitor the bus in order to detect bus errors as soon as they appear and to provide error correction mechanisms.

The simulation environment is coupled with a synthesis tool that allows the synthesis of the selected inter-connection architecture, including the bus coding/decoding scheme and the distributed bus guardians. Designers can thus easily obtain dependability figures as well as performance and area occupation figures.

Figure 4:
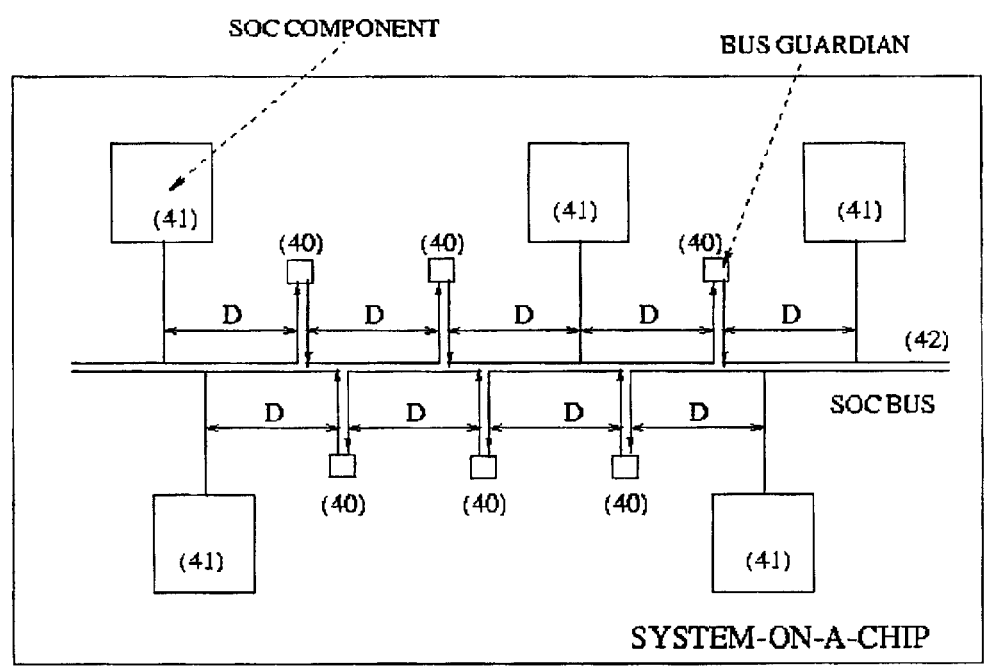
FIG. 4 is diagram of one embodiment of the invention.

An embodiment of the distributed bus guardian scheme of the invention is shown in FIG. 4. It is based on a well know technique frequently used to achieve fault tolerance: online testing and diagnosis, followed by recovery. See for example, D. K. Pradhan, "Fault Tolerant Computing: Theory and Techniques," Prentice Hall Int'l, 1986.

The idea behind the distributed SOC bus guardian scheme is that by frequently monitoring the SOC bus operations, it is possible to provide mechanisms to detect, and possibly correct, a bus error as soon as it appears. Conversely, if error detection/correction is performed by the receivers only, a more complex mechanism is required to guarantee the correctness of the information because the probability of encountering multiple errors increases.

To support this approach, a sequence of small hardware modules called bus guardians 40 are distributed along the SOC bus interconnection architecture between SOC components 41. Examples of SOC components 41 include finite state machines, controller logic, DMA controllers, Bus DMAs and microprocessors. These modules continuously work as controllers and regenerators of the correct information sent on the SOC bus 42. Bus guardians 40 are placed at, or less than, a distance D from each other. Depending on the distance D between SOC components 41, one or more bus guardians 40 are used. The objective is to make distance D as large as possible. However, the distance should be small enough so that it is unlikely that more than one fault will be generated before the next bus guardian 40 or SOC component 41.

Figure 5:
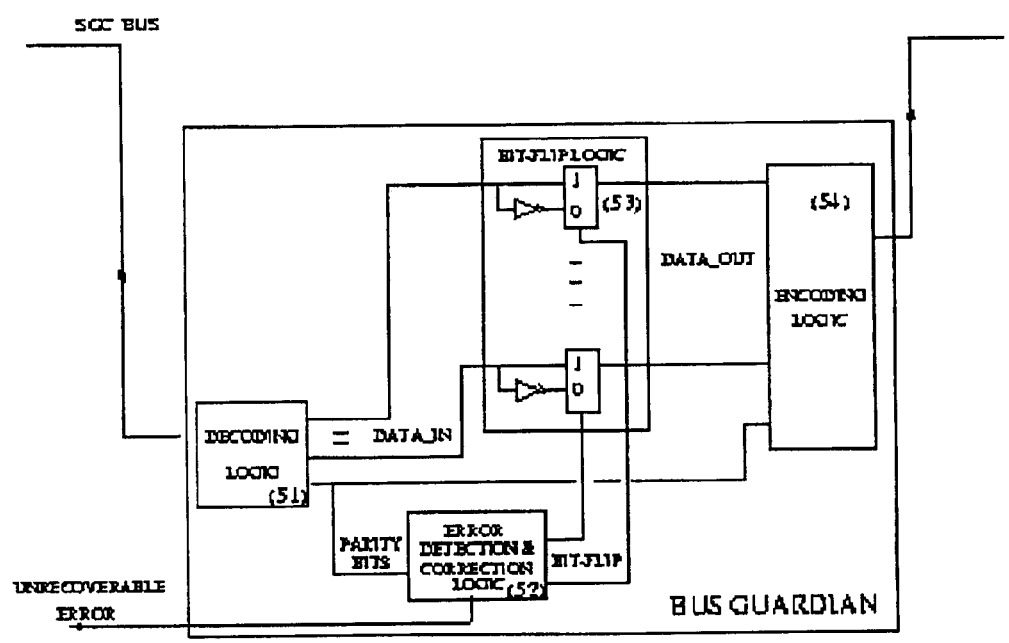
FIG. 5 is a diagram of the structure of a bus guardian.

The structure of a bus guardian 40 is shown in FIG. 5. It contains decoding logic 51 that receives data and control information from the SOC bus 42. Decoding logic 51 separates data bits from control bits. Data from decoding logic 51 (DATA_IN) is sent to bit-flip logic 53. Control information, such as parity bits, is sent to error detection and correction logic 52 which generates a bit_flip signal. Bit-flip logic receives the DATA_IN and bit_flip signals and outputs data (DATA_OUT). When the bit_flip signal is set to 1, it means that the corresponding bit in DATA_IN is faulty and that an error correction (bit flip) is required in order to restore the correct information in DATA_OUT. The DATA_OUT is then received by encoding logic 54 which encodes control information with the data and sends it out to the SOC bus. Error detection and correction logic 52 checks whether the information is correct or if some errors are present. If possible, depending on the adopted bus encoding scheme, correct information can be restored and sent again on the bus. In the other case, if an unrecoverable error has been detected a request of retransmission is issued.

The distance D between two adjacent bus guardians determines the number of bus guardians to be placed on the chip and hence the increase in chip area. The distance D is traded-off with the level of fault tolerance required for the application. The distance D between bus guardians is selected such that the probability to detect and correct single errors in the corresponding section of the SOC interconnects is maximized. Bus guardians could be spaced at a distance less than D, however, the preferred embodiment is to use the distance D in order to minimize the number of bus guardians.

It is assumed that the distance D between bus guardians can be modeled as a function of CMOS fabrication process parameters. The distance D is therefore a function of CMOS fabrication process parameters (i.e. technology used, operating frequency and voltage, etc.).

Since there is no analytical representation of this relationship, a simulation based methodology was developed in which the user is allowed to specify a CMOS fabrication process parameter and then evaluate the efficiency of bus guardians for different values of D.

Figure 6:
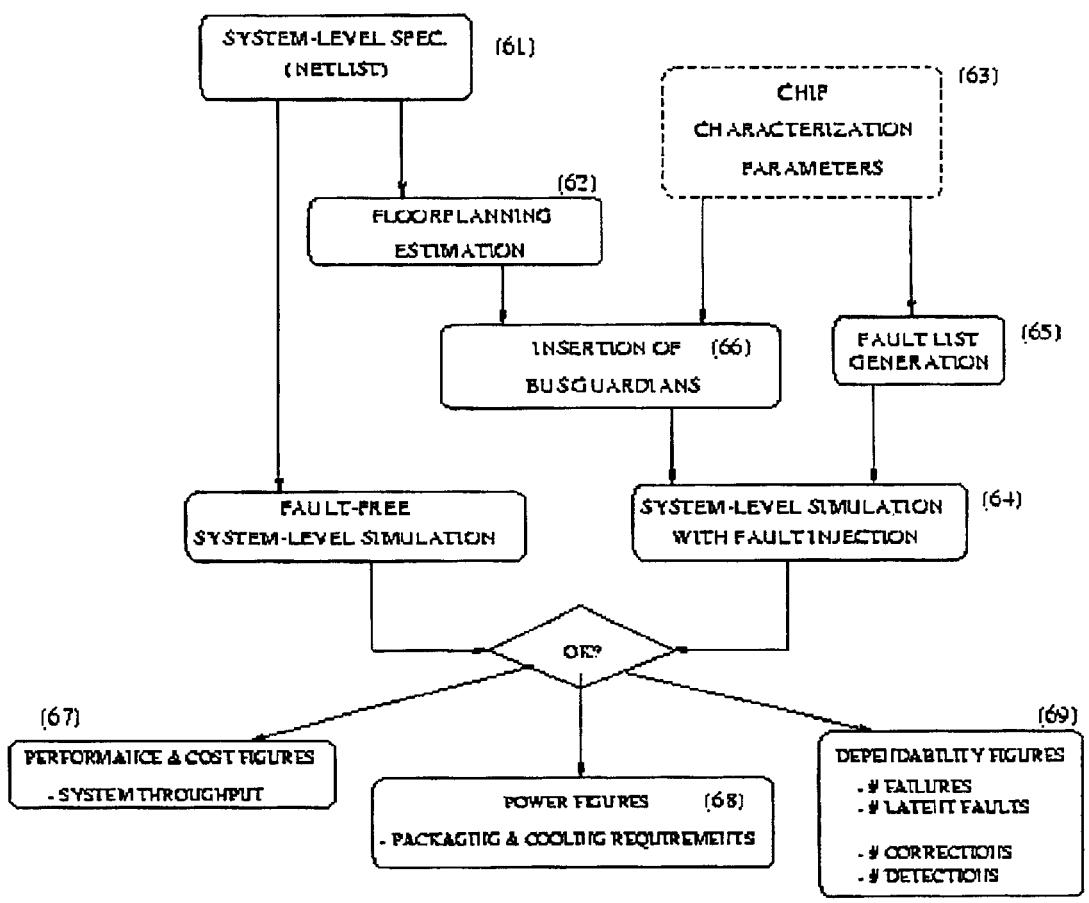
FIG. 6 is a flow chart showing an embodiment of the method of the invention.

The flow of the proposed methodology is shown in FIG. 6. Starting from a netlist containing the system-level specifications 61, a coarse floorplanning 62 is performed using estimates of the physical dimensions of the chip and of each SOC core and the amount of communication (number of physical wires) between cores.

Coarse floorplanning allows the user to estimate the length of each wire on the chip. This information is useful for modeling the impact (in terms of delay and area) of the global interconnections on the system performance. Based on the results of the floorplanning and chip characterization parameters bus guardians are inserted into the system (66). Examples of chip characterization parameters include: such as technology (design rule—i.e. 0.18 $\mu$m); number of levels of metals; power supply voltage (i.e. 5V, 3.3V); I/O interface (TTL, HSTL, LVTTL, etc.); and delay time (for internal gate, internal buffer and output buffer.

The wire length information can also be used together with chip characterization parameters provided by the user in order to extract a statistical probability of the occurrence of single and double faults on each wire in the SOC interconnects. This statistical characterization of the probability of faults is then used to generate a fault list 65. At this point system-level co-simulation 64 can be performed to evaluate the dependability of the system. This is done by injecting faults in the SOC interconnects using the previously generated fault list and comparing the simulation traces with the traces produced by a reference simulation with no faults injected.

By analyzing the simulation trace, the fault effects are categorized as follows:
  no effect: the fault does not modify the system behavior; the system produces the expected outputs and reaches the expected state;
  failure: the fault affects the system behavior and produces an error on the system outputs.

System-level co-simulation also allows the dependability of the distributed bus guardian architecture to be measured using the following two metrics (69):

number of corrections: the number of single faults that have been corrected by the distributed bus guardian architecture;

number of detections: the number of double errors that have resulted in a request of re-transmission from a bus guardian.

Together with the dependability figures described above, the system-level co-simulator also produces performance and cost figures (67) and power figures (68) that can be used in order to evaluate the impact of the fault tolerant scheme on the overall system.

The purpose of this invention is to support a co-simulation-based system-level exploration of different bus encoding schemes for the purpose of trading-off interconnects cost and system reliability. What has not been addressed in this work is the characterization of the environment and the chip. Thus, it is assumed that the user of the methodology will be able to fit those parameters in the proposed design flow.

Cross-coupling between a pair of interconnects can result in two different crosstalk effects: a glitch or a delayed transition, depending on the nature of signal transitions at the interconnects See, for example, X. Bay, et al., supra. In this invention both effects are modeled using a single transient bit flip model.

The bus guardians are extremely useful when crosstalk faults are present that affect the SOC bus interconnect. For example, if a single error correction/double error detection code is used to protect the information transferred on the bus, bus guardians can detect a change in the electrical state of the bus in two adjacent bus sections and restore the correct state in the case of single errors and request a retransmission when more than a single error is present.

Using bus guardians will cause a dramatic increase in the value of some metrics such as the mean time between failures of the chip due to the fact that now, in order to produce an improper operation in the circuit, two crosstalk errors must occur in a section of bus interconnects of length D. By carefully choosing distance D, the probability of an improper operation happening can be made negligible. When a crosstalk glitch has been detected, the bus guardian restores the correct logical value in the bus line in which the fault has appeared.

Figure 7:
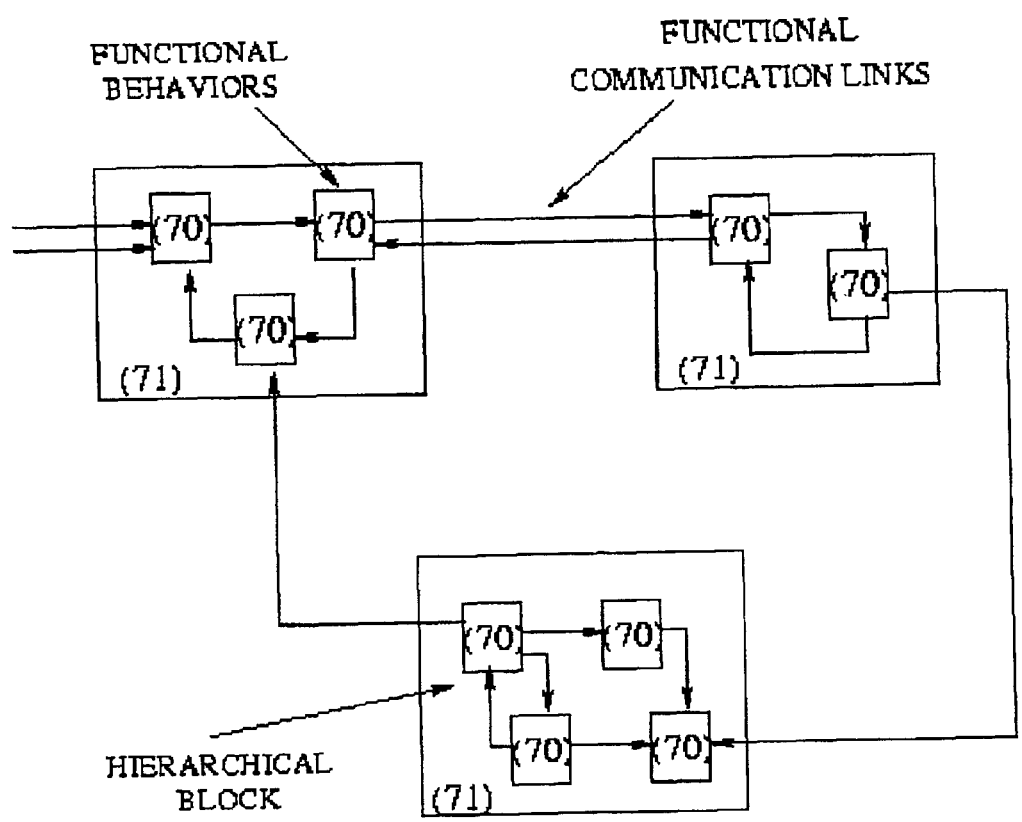
FIG. 7 is a behavioral diagram.

Next, the implementation details of the invention will be described. In the system-level design methodology, a system is described as a netlist containing a network of blocks 70 (e.g., sets of operations) communicating with an event-based communication mechanism. This is called the behavioral diagram (see FIG. 7). Each block 70 contains a functional behavior that is executed whenever a new event is present at one of its input ports. Collections of blocks are referred to as hierarchical blocks 71.

The behavior for each module can be described using either graphical tools (for instance, as a finite state machine), or with a textual language (such as C, C++ and VHDL). The interconnections between the modules are specified either through a textual netlist, or in a graphical environment, where modules can be instantiated and connected with signals, carrying high-level data types or bits.

Figure 8:
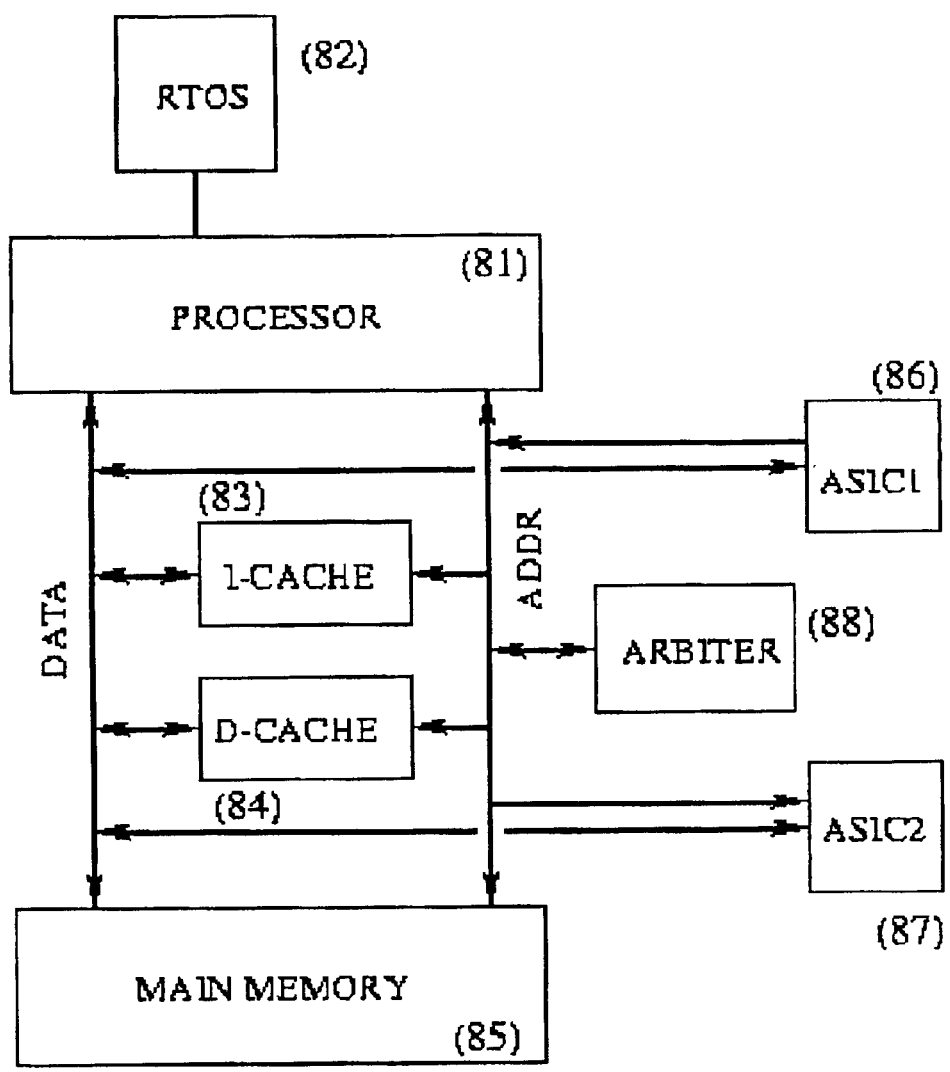
FIG. 8 is a diagram of the architecture to which this invention may be applied.

The hardware architecture that is targeted is shown in FIG. 8. It includes a processor 81 running a real time operating system (RTOS) 82, memories (both main memory 85 and instruction and data caches 83 and 84, respectively), one or more ASICs 86, 87, communication links such as address and data buses, and an arbiter 88.

Each functional block present in the behavioral diagram can be implemented in two ways: as a software task running on the processor, or as a hardware module (i.e., as an ASIC). The mapping of the functional tasks onto the architectural diagram is done by means of parameters. The project may be hierarchical and parameters can be inherited through the hierarchy.

The SOC bus interconnect is modeled by using the semantics of a discrete event simulation engine in which an event has two fields: a tag and a value. The tag is the timestamp, which is ordered among all the events. A discrete event block simply receives events from its input ports and generates events to its output ports.

The method used in the framework to model the effects of sharing resources like buses is based on modifying the event queue depending on the answer of the arbitration policy, that can be configured with a series of parameters (such as priorities for the scheduler, or bus lines width for a bus control unit).

When a module needs to access a shared communication link, such as a bus, the output event is initially stored only in the event queue associated with the module in which it has been generated, with an initial time-stamp that does not consider the time required to access the bus (it considers the bus as always free). If the grant to access the bus is not received, the request is then re-submitted after an amount of time that is automatically computed from the number of words that has been granted to the current owner of the bus and still not transferred. Each time a bus request is not acknowledged with a grant, the time-stamp of the event in the local queue is delayed until the moment in which the access to the bus is obtained. At that point, the event is sent to the global event queue of the discrete event scheduler, and eventually delivered to the destination modules.

Note that only a part of the bus traffic generated by a given functional behavior (that due to the inter-modules communication) has been described. The same mechanism is also used in order to account for the bus traffic generated by the sequence of instruction fetches, and data loads and stores.

Bus encoding is simulated by calling an encoding function each time that a new data has to be emitted from a specific module and calling a decoding function prior to process that value in another module that has received a new event at one of its input ports.

To compute the optimal distance D between bus guardians, an early estimation of the floorplan is required. To evaluate the best floorplan at each level, well know estimation techniques are used. For example, the cost of a floorplan can be estimated from the connections and the area of the floorplan. See for example, M. Sarrafzakeh, et al., "*An Introduction to VLSI Physical Design*," Mc-Graw-Hill, 1996. At the highest level (the one of interest) the area of each core can be estimated using the core's gate count so that the area of a particular choice can be computed for each candidate floorplan. The routing cost can also be estimated by summing up the edge weights. Examples of routing costs for floorplans are shown in FIGS. 9A–9D. These figures show that the cost function to be minimized is a linear combination of the area and the required interconnection length.

Figure 9A:
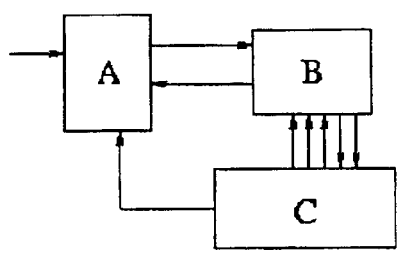
FIGS. 9A–9D are examples of floorplanning.
Figure 9B:
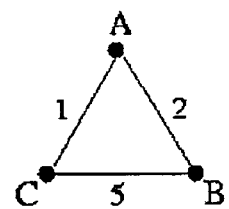
Figure 9C:
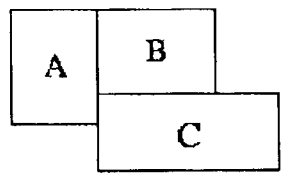
Figure 9D:
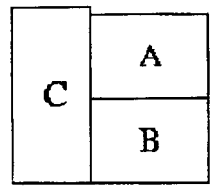

FIG. 9A shows the interconnections of several functional blocks (A, B and C). FIG. 9B is a representation of the number of interconnections between the functional blocks. For example, there is one interconnection between block A and C, two interconnections between block A and B, and five interconnections between blocks B and C. FIGS. 9C and 9D show the estimated routing costs of two candidate floorplans. The costs are determined by calculating the distances between the centers of the blocks, multiplying the distance by the number of interconnections, and adding the results. In this example, the floorplan shown in FIG. 9C is preferred because its cost is lower than the cost of the floorplan shown in FIG. 9D.

A general method is adopted for estimating the chip floorplan by considering each core as an unpartitionable entity. The cores are represented as a graph where the edges represent the connectivity of the cores.

With respect to fault injection, the SOC bus interconnects shown in FIG. 8 are addressed. For these buses, different implementations can be explored such as separate or split buses and also pipelined and burst transactions.

The mechanism that was used for fault injection co-simulation is described in the following article: M. Lajolo, et al. "Evaluating system dependability in a co-design framework," *Proc. Design Automation and Test in Europe*, pp. 586–90, March 2000. Faults in the SOC bus interconnects are injected at the behavioral level by modifying the value of output events generated by functional tasks in the behavioral diagram. Since these events result in data transfers on the data bus, by injecting faults at the behavioral level, faults can be injected in the data bus (see FIG. 10). When bus coding is adopted, the code word to be sent over the bus is computed, then injection takes place and the resulting (possibly corrupted) data is committed to the bus.

Figure 10:
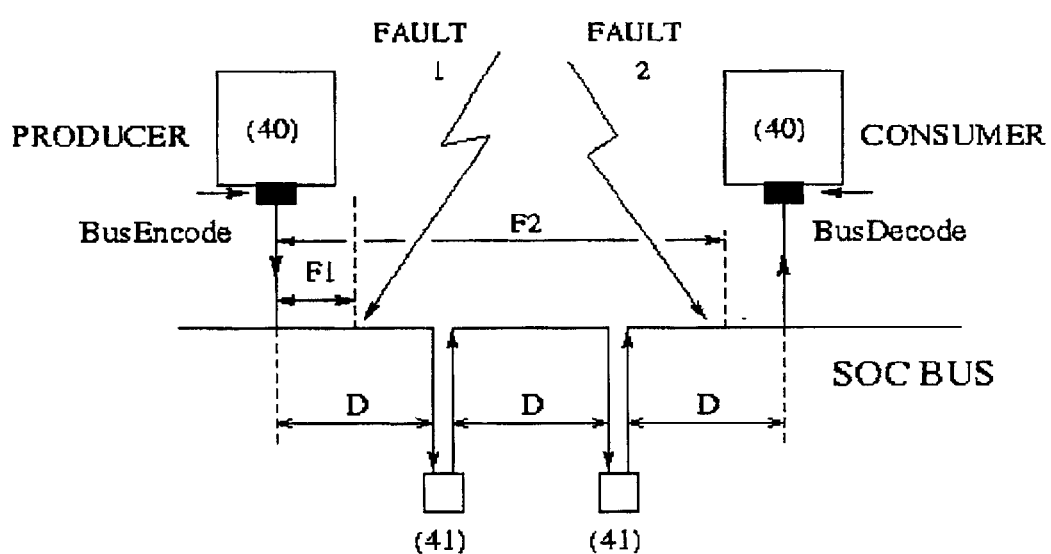
FIG. 10 is a diagram showing fault injection.

Fault injection in the SOC bus is done by specifying:
the SOC component on which the fault has to be injected;
the signal (output event) affected by the fault;
the bit of the selected signal to be affected by the soft error;
the time at which the fault has to be injected;
the location on the bus where the soft error appears (e.g., distances F1 and F2 in FIG. 10).

As specified above, bus guardians are responsible for monitoring, detecting and possibly restoring the correct value on the bus.

In the approach of this invention, designers specify the distance D between bus guardians and then co-simulation is used to perform a fault injection, where faults are selected according to a statistical model of the chip and from the environment in which the chip will operate.

Each communication link in the behavioral diagram carries information that will be transferred on the data bus in the target architecture. A floorplanning estimation is done in order to estimate a length for each communication link between cores in the final implementation. With this information it is possible to estimate the delay introduced by each wire in the system. Whenever a fault has to be injected in the SOC interconnects, since both the location on the bus where the error appears (in terms of its distance from the port that produced the event) and the time at which the fault has to be injected are known, it is possible to determine the number of errors that have been injected in each bus guardian segment of length D and take into account the effects of the bus guardian circuitry (correction, detection, etc.) in the overall system-level simulation.

Next, experimental results will be provided. In order to evaluate the performance of the bus guardian and its impact on the overall system performance, a SPICE simulation of a transistor-level netlist implementing the bus guardians in the case of a 16-bit-width bus was performed.

The bus guardian implements the well known single error correction/double error detection code (SEC-DED). See, for example, K. Gray, "Adding error-correcting circuitry to ASIC memory," *IEEE Spectrum*, pp. 55–60, Apr. 2000. The 2-byte word sent on the bus is encoded using 6 additional parity bits resulting in an encoding efficiency of 72.7%. The encoding efficiency of an encoding scheme is defined as (original bits)/(total bits). Where original bits are the number of bits in the original message and total bits are the total number of bits in the new encoded message. For the particular case of a 2-byte word that is used in this example, six additional bits are required by the SEC-DEC coding. This results in an encoding efficiency of (16)/(16+6)=72.7%.

The bus guardian was been implemented using a state-of-the-art 0.25 $\mu$m cell-based CMOS technology with 1 V power supply and transistors with minimum dimensions (W=0.25 $\mu$m and L=0.25 $\mu$m).

Figure 11A:
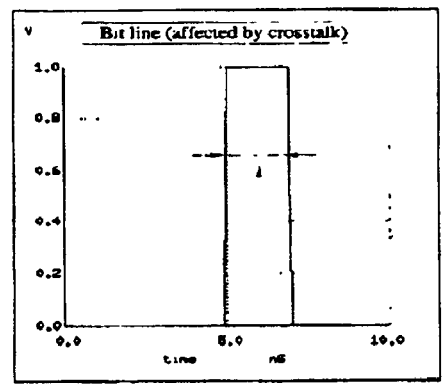
FIGS. 11A, 11B and 11C are graphs showing the results of a SPICE simulation.
Figure 11B:
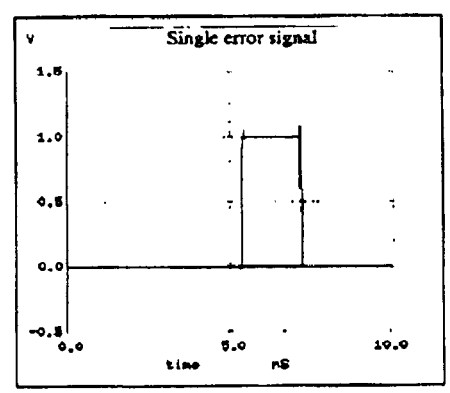
Figure 11C:
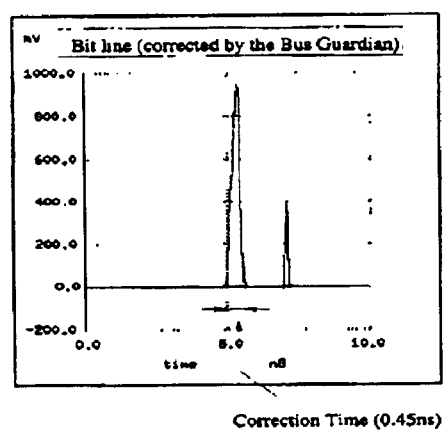

FIGS. 11A–C show an example of a victim line that is subject to crosstalk causing a spike with an amplitude of 1 Volt and with a duration of 2 ns. A single error signal is raised by the bus guardian's circuitry and a correction is then performed. The bottom of the picture shows that the bus guardian is able to correct the fault in less than 0.45 ns. In terms of silicon area, the bus guardian resulted in 220 gates, corresponding to 317.24 $\mu m^2$.

Some experiments on an example system consisting on a receiver and transmitter system for the Internet Protocol (IP) transmission were also performed.

Figure 12:
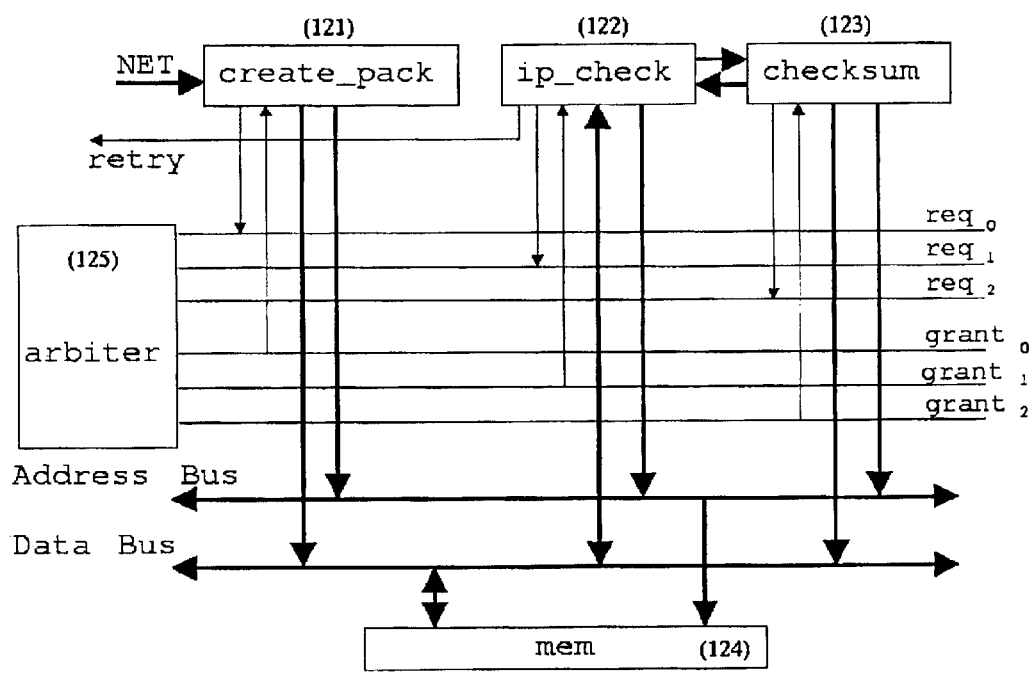
FIG. 12 is a diagram showing a system consisting of a receiver and transmitter system for the Internet Protocol (IP) to which the proposed methodology has been applied.

The system, depicted in FIG. 12 is composed of three operative modules: create_pack 121, ip_check 122 and checksum 123. The modules access a shared memory 124 through an arbiter 125. The module create_pack stores in the memory 124 a bit stream coming from a network cable. When all the required bits have been loaded, the module checksum computes a checksum code and passes it through ip_check that compares it with the one received by the net and already stored in memory 124. If the new values match, a new bit stream is loaded, otherwise an error signal is activated, and the system requests the sender to re-transmit the former message.

Figure 13:
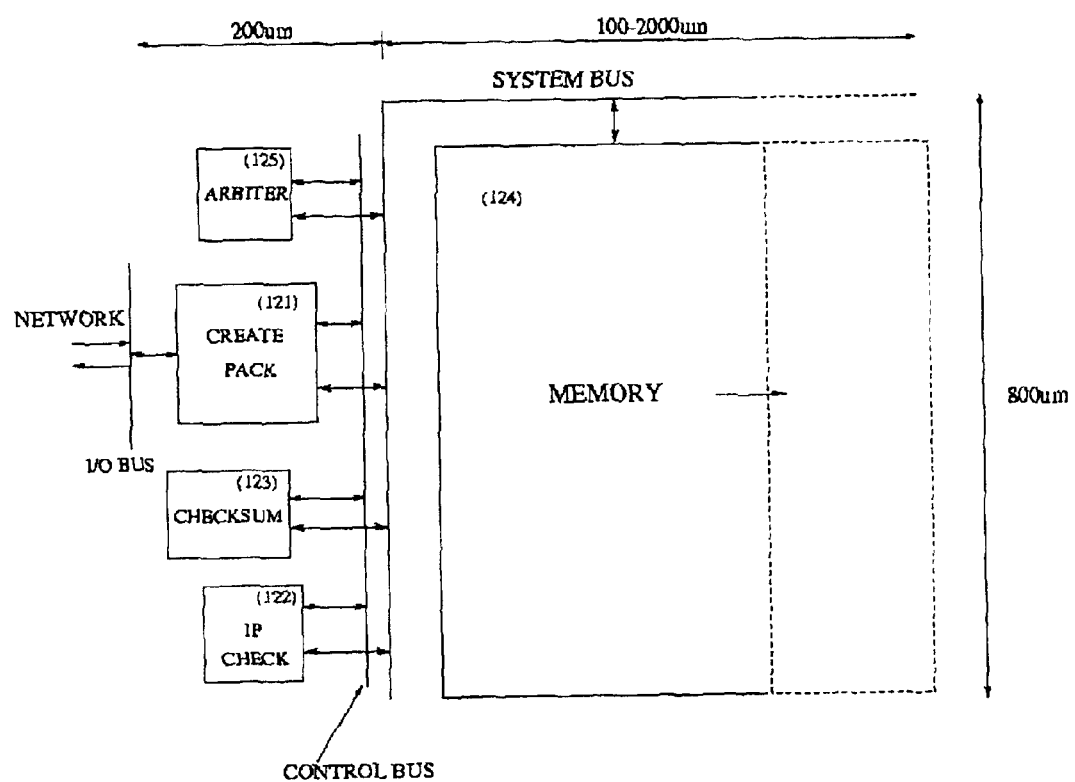
FIG. 13 is a diagram showing an output of a floorplan estimator.

Further information on the entire system is contained in M. Lajolo, A. Raghunathan, S. Dey, L. Lavagno, and A. Sangiovanni-Vincentelli, "Modeling Shared Memory Access Effects during Performance Analysis of HW/SW Systems," Proc. Int. Workshop on Hardware/Software Codesign, pp. 117–121, March 1998. A hardware implementation of all the components was synthesized using the same 0.25 $\mu$m cell-based CMOS technology described above. From the estimates of the size of all the components the approximate floorplanning that was obtained is shown in FIG. 13. FIG. 13 shows an I/O bus for the communication with the network, a control bus for the exchange of the request and grant signals between arbiter 125 and the other modules that can access the shared memory and a system bus for the address and data buses used to access the shared memory 124.

In order to study the impact of the distributed bus guardian architecture on the system, a 16-bit-width system bus was considered in the case in which, depending on the amount of memory used, the length of the bus on the upper side of the memory can vary from 100 $\mu$m to 2000 $\mu$m.

This corresponds to a realistic scenario since the amount of memory required by the application is not fixed a priori. As a typical rule of thumb, a larger amount of on-chip memory can allow the circuit to adapt faster to an increasing load on the network, but of course this requires more silicon area.

Table 1 below shows the suggested distance between bus guardians at three frequencies (50, 1000 and 2000 MHz).

TABLE 1

Suggested distance between bus guardians at 3 different frequencies.

| Freq. [MHz] | D [$\mu$m] |
|---|---|
| 50 | 240 |
| 1000 | 120 |
| 2000 | 80 |

Figure 1:
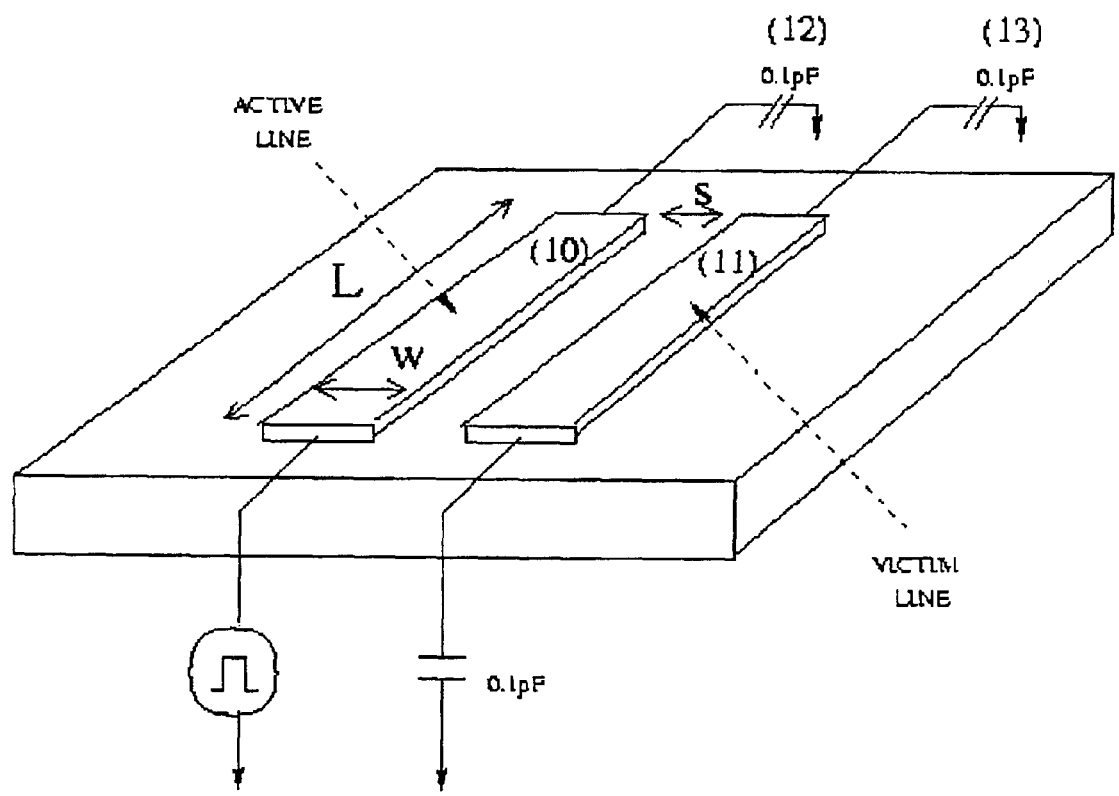
FIG. 1 is a drawing of a system consisting of two adjacent lines.
Figure 2:
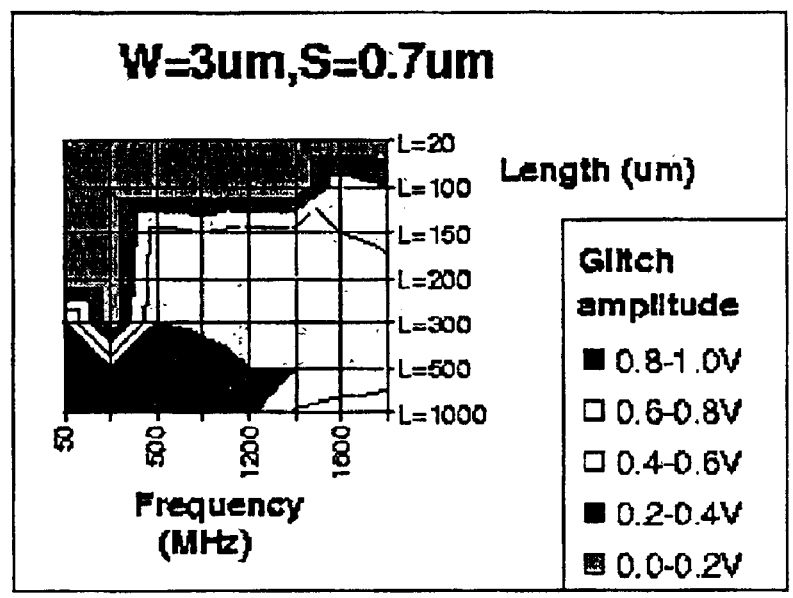
FIG. 2 is a graph of the results obtained by varying the frequency of a signal on an active line and the length of both lines.
Figure 3:
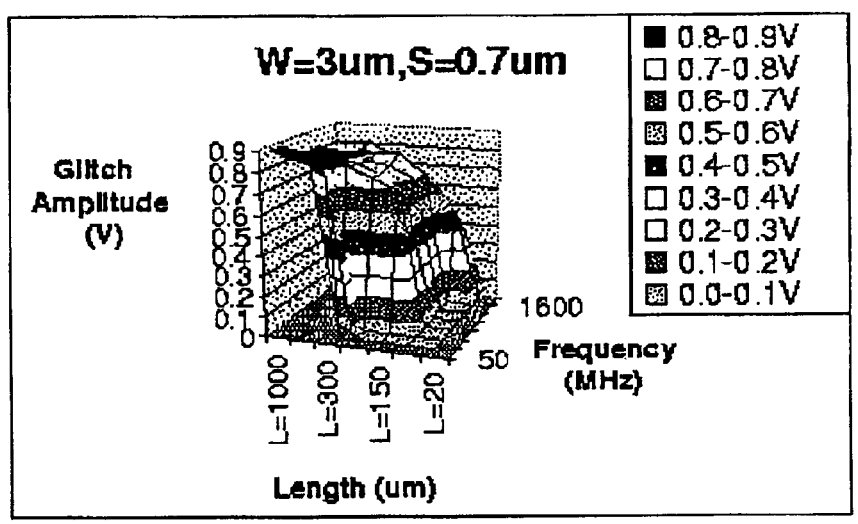
FIG. 3 is a three dimensional representation of the graph shown in FIG. 2.

As described above, this distance is selected in order to maximize the probability to detect and correct single errors in the corresponding section of the SOC interconnects. This information has been extracted from FIG. 2 by assuming a perfect decision between logical level 1 and 0 at 0.5V and by accepting an amount of glitch due to crosstalk of less than 0.4 V.

Figure 14:
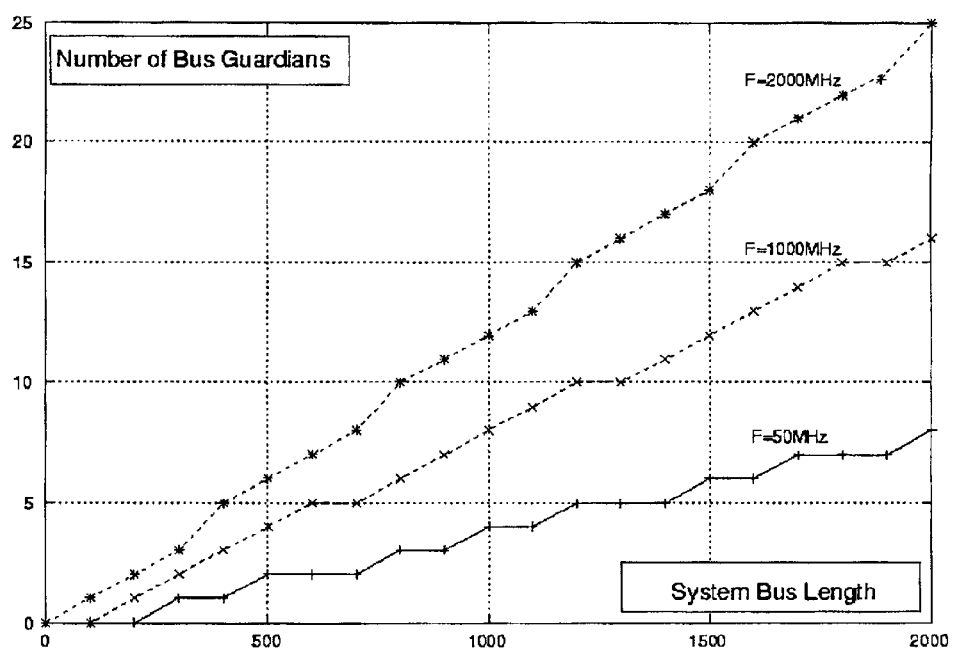
FIG. 14 is a graph showing the number of bus guardians required for different system bus lengths at various frequencies.

FIG. 14 shows the number of bus guardians required for different system bus length at three different frequencies.

Figure 15:
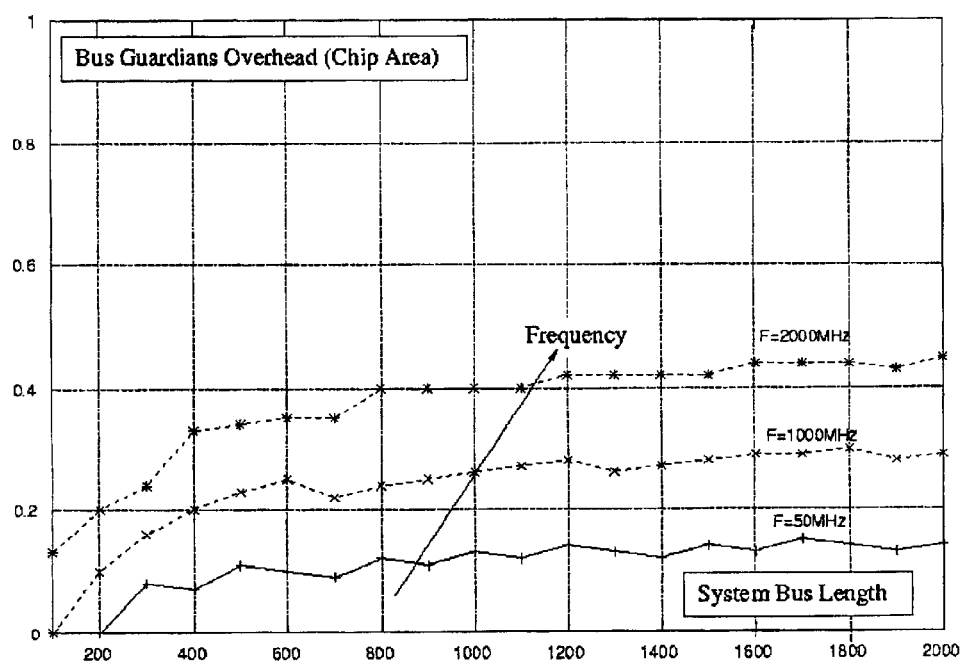
FIG. 15 is a graph showing the percentage of chip area overhead due to bus guardians.

FIG. 15 shows the percentage of chip area overhead due to bus guardians. The area overhead increases by increasing the frequency and also the length of the bus. In fact, an increase in the frequency results in a reduction of the suggested distance between bus guardians so that it is necessary to put more guardians on the chip. On the other hand, an increase in the length of the bus simply requires more guardians to be distributed along the bus at the suggested regular distance. In the worst case (when F=2000 MHz and length=2000 $\mu$m) there is a 42% of area overhead due to bus guardians.

Figure 16:
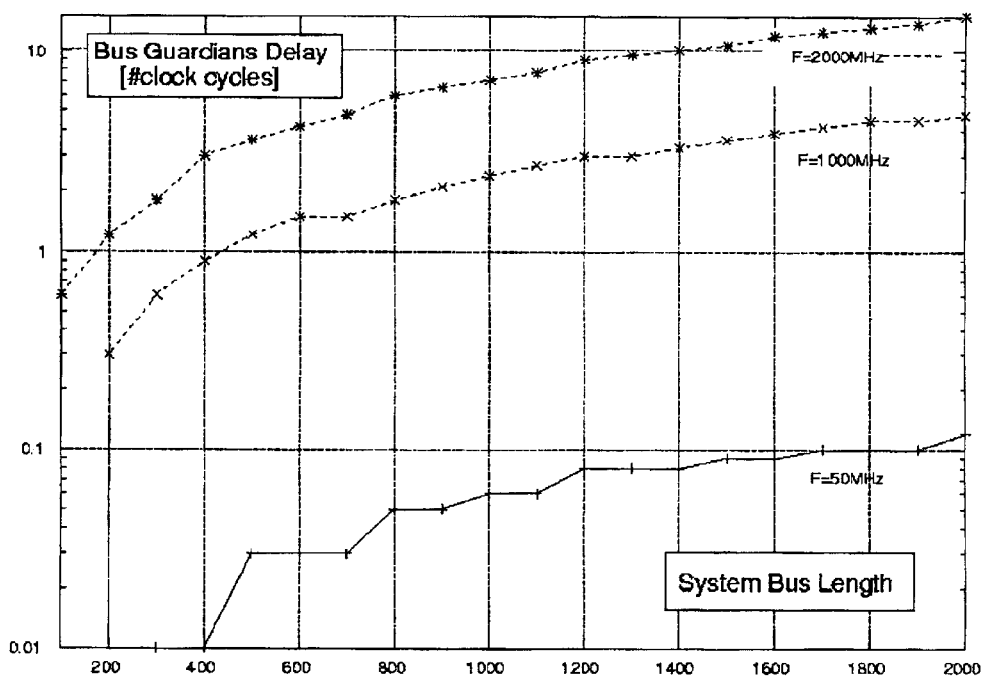
FIG. 16 is a graph showing the impact of delay due to bus guardians on system performance.

FIG. 16 shows the impact of the delay due to bus guardians on the system performance. This delay has been computed by multiplying the delay due to a bus guardian (extracted from SPICE simulations) with the number of bus guardians required along the bus for exploiting the SEC-DED encoding.

The conclusion that can be drawn from these results is that the performance overhead is negligible for all the ranges of bus length that have been considered only at the frequency of 50 MHz. At a frequency of 1000 MHz, and with a bus length of more than 700 $\mu$m, the number of penalty cycles required to access the memory becomes significant.

The need for early evaluation of system dependability is becoming an issue for designers-involved in the design of safety-critical embedded systems.

This invention addresses the analysis of the reliability of SOC designs when bus errors affect the SOC interconnection architecture. An event driven simulation environment provided with the capability of performing fault injection experiments has been proposed to evaluate the effect of bus errors. Moreover, the simulation environment has been enriched with the possibility of simulating several bus coding schemes, thus freeing the designer from the burden of implementing a coding scheme from scratch. Moreover, an approach to further enhance the error detection and correction mechanism of the system bus has been proposed, which is based on the concept of distributed bus guardians.

While this invention has been described in its preferred form, it will be appreciated that changes may be made in the form, construction, procedure and arrangement of its various elements and steps without departing from its spirit or scope.

What is claimed is:

1. A system comprising:

a bus;

a plurality of SOC components, each connected to the bus; and a bus guardian connected to the bus between at least two of the SOC components;

wherein the bus guardian detects and corrects a fault that occurs on the bus between the at least two SOC components; and wherein the distance between the bus guardian and at least one of the SOC components is such that the probability of two faults occurring on the bus between the bus guardian and SOC component is negligible.

2. A system according to claim 1, wherein the bus guardian is placed at, or less than, a predetermined distance from the SOC components.

3. A system according to claim 1, further comprising a plurality of bus guardians connected between at least two of the SOC components.

4. A system according to claim 3, wherein the bus guardians are placed at, or less than, a predetermined distance from the SOC components and each other.

5. A method for distributing a bus guardian and SOC components on a bus in a system on a chip comprising:

determining a fabrication parameter of the system on a chip;

determining a distance between the bus guardian and a SOC component based on the fabrication parameter;

wherein the distance is determined such that the probability of two faults occurring on the bus between the bus guardian and SOC component is negligible.

6. A method according to claim 5, wherein the fabrication parameter is technology used.

7. A method according to claim 5, wherein the fabrication parameter is operating frequency.

8. A method according to claim 5, wherein the fabrication parameter is voltage.

9. A method for distributing a bus guardian and SOC components on a bus in a system on a chip comprising:

estimating a floorplan based on a specification;

determining a distance between the bus guardian and a SOC component based on the floorplan parameter;

wherein the distance is determined such that the probability of two faults occurring on the bus between the bus guardian and SOC component is negligible.

10. A method according to claim 9, further comprising:

performing a fault-free simulation based on the specification;

performing a simulation with fault detection based on the determined distance.

* * * * *